(12) United States Patent
Richieri

(10) Patent No.: US 9,627,553 B2
(45) Date of Patent: *Apr. 18, 2017

(54) SILICON CARBIDE SCHOTTKY DIODE

(71) Applicant: Giovanni Richieri, Druento (IT)

(72) Inventor: Giovanni Richieri, Druento (IT)

(73) Assignee: SILICONIX TECHNOLOGY C.V., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/759,872

(22) Filed: Feb. 5, 2013

(65) Prior Publication Data

US 2014/0042459 A1    Feb. 13, 2014

Related U.S. Application Data

(63) Continuation of application No. 11/581,536, filed on Oct. 16, 2006, now Pat. No. 8,368,165.

(60) Provisional application No. 60/728,728, filed on Oct. 20, 2005.

(51) Int. Cl.
    *H01L 29/47*      (2006.01)
    *H01L 29/872*     (2006.01)
    *H01L 29/16*      (2006.01)

(52) U.S. Cl.
CPC ............ *H01L 29/872* (2013.01); *H01L 29/47* (2013.01); *H01L 29/1608* (2013.01)

(58) Field of Classification Search
CPC ....... H01L 29/872; H01L 29/20; H01L 29/47; H01L 29/66; H01L 29/66143; H01L 29/1608; H01L 27/06; H01L 29/00

USPC ................ 257/676, 155, 260, 267, 280–284, 257/449–457, 471–474, 77, 478, 253
See application file for complete search history.

(56) References Cited

U.S. PATENT DOCUMENTS

| | | |
|---|---|---|
| 4,036,672 A | 7/1977 | Kobayashi |
| 4,206,540 A | 6/1980 | Gould |
| 4,648,175 A | 3/1987 | Metz, Jr. et al. |
| 4,672,738 A | 6/1987 | Stengl et al. |
| 4,796,084 A | 1/1989 | Kamasaki et al. |
| 4,862,244 A | 8/1989 | Yamagishi |
| 4,903,189 A | 2/1990 | Ngo et al. |
| 4,990,994 A | 2/1991 | Furukawa et al. |
| 5,003,372 A | 3/1991 | Kim et al. |
| 5,047,833 A | 9/1991 | Gould |
| 5,113,237 A | 5/1992 | Stengl |
| 5,233,215 A | 8/1993 | Baliga |
| 5,323,040 A | 6/1994 | Baliga |
| 5,362,975 A | 11/1994 | von Windheim et al. |
| 5,384,470 A | 1/1995 | Tachibana et al. |
| 5,436,174 A | 7/1995 | Baliga et al. |
| 5,527,745 A | 6/1996 | Dixit et al. |

(Continued)

FOREIGN PATENT DOCUMENTS

| | | |
|---|---|---|
| DE | 19840032 | 11/1999 |
| DE | 10002362 | 8/2001 |

(Continued)

OTHER PUBLICATIONS

International Search Report for PCT/US05/38118 dated Feb. 6, 2007. (reference povided in the parent U.S. Pat. No. 8,368,165 per 37 C.F.R. 1.98(d).).

*Primary Examiner* — Chuong A Luu

(57) ABSTRACT

A SiC Schottky diode which includes a Schottky barrier formed on a silicon face 4H—SiC body.

20 Claims, 2 Drawing Sheets

(56) References Cited

U.S. PATENT DOCUMENTS

| | | | |
|---|---|---|---|
| 5,689,128 A | 11/1997 | Hshieh et al. | |
| 5,712,502 A | 1/1998 | Mitlehner et al. | |
| 5,747,831 A | 5/1998 | Loose et al. | |
| 5,753,938 A | 5/1998 | Thapar et al. | |
| 5,789,311 A * | 8/1998 | Ueno et al. | 438/573 |
| 5,801,836 A | 9/1998 | Bakowski et al. | |
| 5,914,500 A | 6/1999 | Bakowski et al. | |
| 5,915,179 A | 6/1999 | Etou et al. | |
| 5,932,894 A | 8/1999 | Bakowski et al. | |
| 5,977,605 A | 11/1999 | Bakowski et al. | |
| 6,040,237 A | 3/2000 | Bakowski et al. | |
| 6,040,600 A | 3/2000 | Uenishi et al. | |
| 6,040,617 A | 3/2000 | Patel | |
| 6,100,572 A | 8/2000 | Kinzer | |
| 6,150,246 A | 11/2000 | Parsons | |
| 6,177,712 B1 | 1/2001 | Miyasaka | |
| 6,207,591 B1 | 3/2001 | Aoki et al. | |
| 6,229,194 B1 | 5/2001 | Lizotte | |
| 6,303,986 B1 | 10/2001 | Shook | |
| 6,320,205 B1 | 11/2001 | Pfirsch et al. | |
| 6,330,967 B1 | 12/2001 | Milewski et al. | |
| 6,353,252 B1 | 3/2002 | Yasuhara et al. | |
| 6,362,495 B1 * | 3/2002 | Schoen et al. | 257/77 |
| 6,373,076 B1 * | 4/2002 | Alok | H01L 21/0445 257/109 |
| 6,410,958 B1 | 6/2002 | Usui et al. | |
| 6,432,750 B2 | 8/2002 | Jeon et al. | |
| 6,441,455 B1 | 8/2002 | Dutta | |
| 6,498,368 B2 | 12/2002 | Sakamoto et al. | |
| 6,509,240 B2 | 1/2003 | Ren et al. | |
| 6,514,782 B1 | 2/2003 | Wierer, Jr. et al. | |
| 6,562,647 B2 | 5/2003 | Zandman et al. | |
| 6,573,534 B1 | 6/2003 | Kumar et al. | |
| 6,573,537 B1 | 6/2003 | Steigerwald et al. | |
| 6,586,801 B2 | 7/2003 | Onishi et al. | |
| 6,605,862 B2 | 8/2003 | Van Dalen et al. | |
| 6,621,122 B2 | 9/2003 | Qu | |
| 6,622,380 B1 | 9/2003 | Grigg | |
| 6,624,522 B2 | 9/2003 | Standing et al. | |
| 6,630,698 B1 | 10/2003 | Deboy et al. | |
| 6,635,944 B2 | 10/2003 | Stoisiek | |
| 6,673,662 B2 | 1/2004 | Singh | |
| 6,674,126 B2 | 1/2004 | Iwamoto et al. | |
| 6,683,347 B1 | 1/2004 | Fujihira | |
| 6,700,141 B2 | 3/2004 | Iwamoto et al. | |
| 6,713,813 B2 | 3/2004 | Marchant | |
| 6,740,931 B2 | 5/2004 | Kouzuki et al. | |
| 6,762,455 B2 | 7/2004 | Oppermann et al. | |
| 6,764,906 B2 | 7/2004 | Darwish | |
| 6,768,170 B2 | 7/2004 | Zhou | |
| 6,791,167 B2 | 9/2004 | Hayashi et al. | |
| 6,812,282 B2 | 11/2004 | Chang et al. | |
| 6,828,609 B2 | 12/2004 | Deboy et al. | |
| 6,844,571 B2 | 1/2005 | Krames et al. | |
| 6,849,900 B2 | 2/2005 | Aida et al. | |
| 6,897,133 B2 | 5/2005 | Collard | |
| 6,936,850 B2 | 8/2005 | Friedrichs et al. | |
| 6,949,454 B2 | 9/2005 | Swanson et al. | |
| 6,960,829 B2 | 11/2005 | Hogerl | |
| 6,979,862 B2 | 12/2005 | Henson | |
| 6,992,340 B2 | 1/2006 | Tanaka | |
| 7,034,376 B2 | 4/2006 | Okada et al. | |
| 7,073,890 B2 | 7/2006 | Cabal et al. | |
| 7,166,890 B2 | 1/2007 | Sridevan | |
| 7,173,284 B2 | 2/2007 | Kumar et al. | |
| 7,262,434 B2 * | 8/2007 | Okamura | H01L 29/1608 257/453 |
| 7,265,045 B2 | 9/2007 | Lee et al. | |
| 7,265,388 B2 | 9/2007 | Fukuda et al. | |
| 7,299,538 B2 | 11/2007 | Tactic-Lucic | |
| 7,315,081 B2 | 1/2008 | Standing | |
| 7,394,158 B2 | 7/2008 | Carta et al. | |
| 7,411,218 B2 | 8/2008 | Seng et al. | |
| 7,492,003 B2 | 2/2009 | Kinzer | |
| 7,507,650 B2 | 3/2009 | Nakamura et al. | |
| 7,649,213 B2 | 1/2010 | Hatakeyama et al. | |
| 7,687,907 B2 | 3/2010 | Okuda et al. | |
| 7,718,470 B2 | 5/2010 | Hsu | |
| 7,777,292 B2 | 8/2010 | Ota et al. | |
| 7,812,441 B2 | 10/2010 | Carta et al. | |
| 7,834,376 B2 | 11/2010 | Carta et al. | |
| 8,368,165 B2 * | 2/2013 | Richieri | 257/473 |
| 8,368,211 B2 | 2/2013 | Standing et al. | |
| 8,368,223 B2 | 2/2013 | Standing | |
| 2001/0043172 A1 | 11/2001 | McGrath et al. | |
| 2001/0052601 A1 | 12/2001 | Onishi et al. | |
| 2002/0063281 A1 | 5/2002 | Tihanyl | |
| 2002/0064930 A1 | 5/2002 | Ishikawa | |
| 2002/0076851 A1 | 6/2002 | Eden et al. | |
| 2002/0109211 A1 | 8/2002 | Shinohara | |
| 2002/0171087 A1 | 11/2002 | Krames et al. | |
| 2002/0179909 A1 * | 12/2002 | Uchida et al. | 257/73 |
| 2003/0006425 A1 | 1/2003 | Bol et al. | |
| 2003/0042538 A1 * | 3/2003 | Kumar et al. | 257/328 |
| 2003/0075783 A1 | 4/2003 | Yoshihara et al. | |
| 2003/0119300 A1 | 6/2003 | Chiu et al. | |
| 2003/0127747 A1 | 7/2003 | Kajiwara et al. | |
| 2003/0162355 A1 | 8/2003 | Sankin et al. | |
| 2003/0168734 A1 | 9/2003 | Fang | |
| 2003/0176031 A1 | 9/2003 | Onishi et al. | |
| 2003/0183895 A1 | 10/2003 | Okamura et al. | |
| 2004/0012930 A1 | 1/2004 | Grigg | |
| 2004/0051118 A1 | 3/2004 | Bruhns et al. | |
| 2004/0063240 A1 | 4/2004 | Madrid et al. | |
| 2004/0070060 A1 | 4/2004 | Mamitsu et al. | |
| 2004/0104489 A1 | 6/2004 | Larking | |
| 2004/0110330 A1 * | 6/2004 | Collard | 438/167 |
| 2004/0113264 A1 | 6/2004 | Akerling et al. | |
| 2004/0135178 A1 | 7/2004 | Onose et al. | |
| 2004/0145380 A1 | 7/2004 | Babcock et al. | |
| 2004/0150040 A1 | 8/2004 | Nitta et al. | |
| 2004/0169262 A1 | 9/2004 | Oliver et al. | |
| 2004/0207092 A1 | 10/2004 | Burrell et al. | |
| 2004/0212011 A1 | 10/2004 | Ryu | |
| 2004/0212093 A1 | 10/2004 | Chopra et al. | |
| 2004/0245570 A1 | 12/2004 | Ninomiya | |
| 2004/0262685 A1 | 12/2004 | Zingg | |
| 2005/0012143 A1 | 1/2005 | Tanaka et al. | |
| 2005/0023680 A1 | 2/2005 | Wang et al. | |
| 2005/0029557 A1 | 2/2005 | Hatakeyama et al. | |
| 2005/0034888 A1 | 2/2005 | Hoffmann et al. | |
| 2005/0067630 A1 | 3/2005 | Zhao | |
| 2005/0072984 A1 | 4/2005 | Kwak et al. | |
| 2005/0077615 A1 | 4/2005 | Yu et al. | |
| 2005/0082570 A1 | 4/2005 | Sridevan | |
| 2005/0082611 A1 | 4/2005 | Peake et al. | |
| 2005/0091988 A1 | 5/2005 | Stewart et al. | |
| 2005/0116344 A1 | 6/2005 | Humpston | |
| 2005/0136635 A1 | 6/2005 | Savastiouk et al. | |
| 2005/0139947 A1 | 6/2005 | Okada et al. | |
| 2005/0200011 A1 | 9/2005 | Standing et al. | |
| 2005/0230715 A1 | 10/2005 | Hoshino et al. | |
| 2005/0253168 A1 | 11/2005 | Wu et al. | |
| 2006/0003514 A1 | 1/2006 | Richieri | |
| 2006/0065899 A1 | 3/2006 | Hatakeyama et al. | |
| 2006/0086939 A1 | 4/2006 | Carta et al. | |
| 2006/0145283 A1 | 7/2006 | Zhu et al. | |
| 2006/0145319 A1 | 7/2006 | Sun et al. | |
| 2006/0214242 A1 | 9/2006 | Carta et al. | |
| 2006/0220027 A1 * | 10/2006 | Takahashi et al. | 257/77 |
| 2006/0226504 A1 | 10/2006 | Hatakeyama et al. | |
| 2006/0255423 A1 | 11/2006 | Ryu et al. | |
| 2007/0222025 A1 | 9/2007 | Husain et al. | |
| 2007/0228505 A1 | 10/2007 | Mazzola et al. | |
| 2008/0237608 A1 | 10/2008 | Richieri | |
| 2008/0286968 A1 | 11/2008 | Carta et al. | |
| 2009/0067630 A1 | 3/2009 | Daemen et al. | |
| 2009/0104738 A1 | 4/2009 | Ring et al. | |
| 2010/0068855 A1 | 3/2010 | Saxler et al. | |

(56) References Cited

U.S. PATENT DOCUMENTS

| | | |
|---|---|---|
| 2011/0248284 A1 | 10/2011 | Carta et al. |
| 2011/0278591 A1 | 11/2011 | Carta et al. |

FOREIGN PATENT DOCUMENTS

| | | |
|---|---|---|
| EP | 0604194 | 6/1994 |
| EP | 0681326 A2 | 11/1995 |
| EP | 0958923 A2 | 11/1999 |
| EP | 1349202 | 1/2003 |
| EP | 1739753 | 3/2007 |
| FR | 2579023 | 9/1986 |
| JP | 1187698 | 7/1989 |
| JP | 7302896 | 11/1995 |
| JP | 09-036393 | 2/1997 |
| JP | 11-087690 | 3/1999 |
| JP | 11348355 | 12/1999 |
| JP | 2000-022178 | 1/2000 |
| JP | 2001313391 | 11/2001 |
| JP | 2002-118268 | 4/2002 |
| JP | 2002158363 | 5/2002 |
| JP | 2002261295 | 9/2002 |
| JP | 2003074951 | 3/2003 |
| JP | 2003258271 | 9/2003 |
| JP | 2003273127 | 9/2003 |
| JP | 2004079988 | 3/2004 |
| JP | 2004-111759 | 4/2004 |
| JP | 2004099898 | 4/2004 |
| JP | 2004-221513 | 8/2004 |
| JP | 2005079339 | 3/2005 |
| JP | 2005-286197 | 10/2005 |
| JP | 2005-311347 | 11/2005 |
| JP | 2006-100593 | 4/2006 |
| WO | 9727626 | 7/1997 |
| WO | 0038242 | 6/2000 |
| WO | 0143172 | 6/2001 |
| WO | 03038906 | 5/2003 |
| WO | 2005091988 | 10/2005 |
| WO | 2005093840 | 10/2005 |
| WO | 2006047382 | 5/2006 |
| WO | 2006074382 | 7/2006 |

\* cited by examiner

SILICON CARBIDE SCHOTTKY DIODE

RELATED APPLICATIONS

This application is a continuation of and claims the benefit of co-pending, commonly-owned U.S. patent application Ser. No. 11/581,536, filed on Oct. 16, 2006, now U.S. Pat. No. 8,368,165 by Giovanni Richieri, and titled "Silicon carbide schottky diode," which claims the benefit of and priority to the provisional patent application, Ser. No. 60/728,728, filed on Oct. 20, 2005, by Giovanni Richieri, and titled "Silicon carbide schottky diode," each of which are hereby incorporated by reference in their entirety.

FIELD OF INVENTION

The present invention relates to Schottky diodes and in particular to SiC Schottky diodes.

BACKGROUND ART

Although the main intrinsic parameters in Silicon Carbide material have not been exhaustively studied, several experimental and theoretical studies have been performed in recent years in order to better describe the current transport in ohmic and rectifying contact on SiC.

It has been known that in Schottky diodes the metal semiconductor interface (MST) between the Schottky barrier metal and the semiconductor plays a crucial role in the electrical performance of electronic devices. Many factors can worsen the performance of the MSI in a Schottky diode. For example, the quality of the semiconductor surface prior to the deposition of the Schottky barrier metal can cause the device to exhibit characteristics that are different from the ideal characteristics.

Current-voltage (I-V) and capacitance-voltage (C-V) characterizations are useful methods for determining the Schottky barrier height from which the MSI uniformity can be obtained. It has been known that the barrier height determined from C-V measurements often exceeds the value extracted from forward I-V measurements. The discrepancy is also seen to be greater for Schottky contacts with high ideality factor, i.e. poor Schottky MSI quality. Sullivan et al., J. Appl. Physics, 70, No. 12, (1991), 7403-7424, have explained that such a discrepancy is due to barrier height inhomogeneities, and have demonstrated that if the barrier height is assumed to follow some statistical distribution, the barrier height value extracted from C-V measurements is the arithmetic mean of the barrier height distribution (the capacitance of the Schottky contact comes from the modulation of the total space-charge as a function of bias). On the other hand, the value from I-V characterization is well below the value extracted from capacitance analysis, and is dominated by the current that flows through regions of lower barrier height. Also, the inhomogeneity of the barrier height is believed to be a primary reason for the observation of large ideality factors (n>1.1). For intimate contact and uniform MSI, the barrier height values extracted from C-V and I-V characterization are expected to be in close correlation, and ideality factors very close to unity.

SUMMARY OF THE INVENTION

A semiconductor device according to the present invention is a SiC Schottky diode which includes a SiC substrate of one conductivity, a silicon face SiC epitaxial body of the one conductivity formed on a first surface of a the SiC substrate, a Schottky metal barrier formed on the silicon face of the SiC epitaxial body, a back power electrode on a second surface of the SiC substrate opposite said first surface of the SiC substrate.

In one embodiment of the present invention the Schottky metal barrier is formed of Titanium, and the silicon face epitaxial SiC is 4H—SiC. It has been found that this combination results in a very uniform MSI, which allows for accurate electrical characterization of the device.

Other features and advantages of the present invention will become apparent from the following description of the invention which refers to the accompanying drawings.

DETAILED DESCRIPTION OF THE FIGURES

Figure 1:
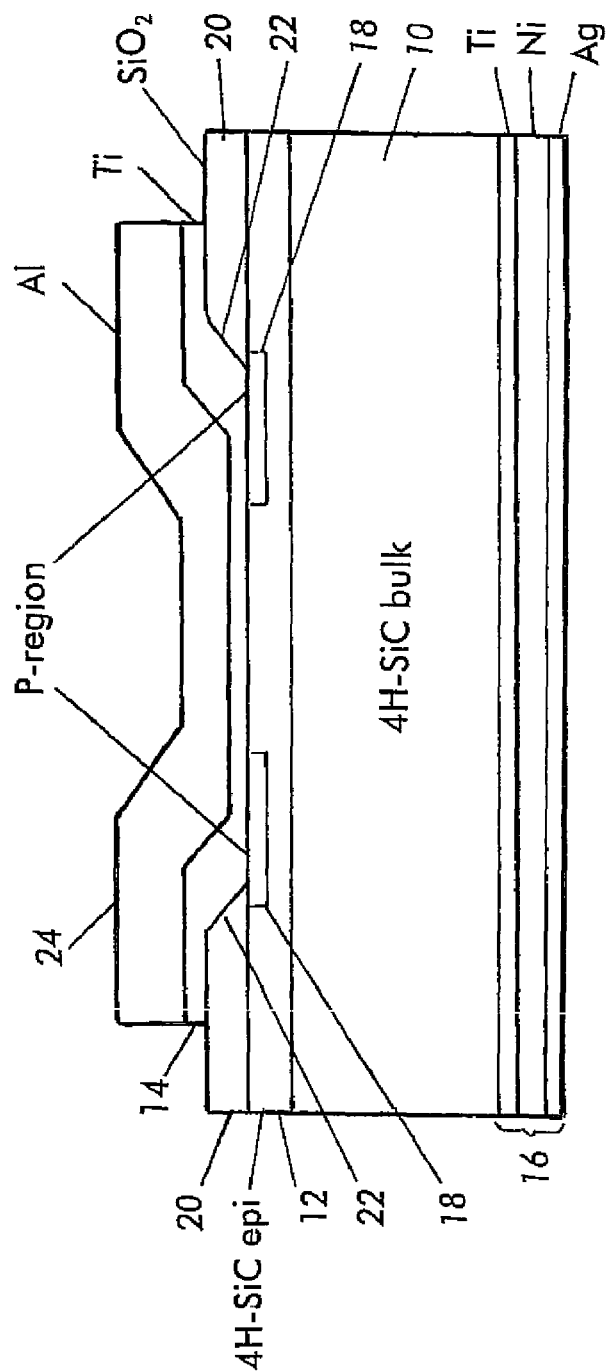
FIG. 1 shows a cross-sectional view of a portion of a SiC semiconductor device according to the present invention.

A power semiconductor device according to the preferred embodiment of the present invention is a discrete Schottky diode that includes SiC substrate 10 (preferably 4H—SiC bulk SiC) of N-type conductivity, silicon face 4H—SiC epitaxial body 12 of N-type conductivity formed on one surface of substrate 10, Schottky metal body (Schottky barrier) 14 formed over and in Schottky contact with epitaxial body 12, and a back power electrode 16 formed on another opposite surface of substrate 10. A region of P-type conductivity 18 serving as a guard ring is diffused into epitaxial body 12, is in contact with Schottky body 14, and defines the other boundary of the active region (i.e. region defined by the Schottky contact between Schottky body 14 and epitaxial body 12) of the device. A device according to the preferred embodiment further includes a field insulation body 20 disposed on epitaxial body 12 and surrounding the active region of the device. Note that field insulation body 20 includes sidewalls 22 that taper toward the active region of the device, and that Schottky body 14 extends over sidewalls 22 and a portion of the top surface of field insulation body 20. A device according to the preferred embodiment further includes a metallic front power electrode 24 which is disposed over at least Schottky body 14.

In the preferred embodiment, Schottky body 14 is composed of titanium (which has been observed to make a uniform MSI with silicon face 4H—SiC), front power electrode 24 is composed of aluminum, back power electrode 16 is composed of a trimetal stack of titanium (in ohmic contact with substrate 10), nickel (formed on the titanium layer), and silver (formed on the nickel layer). Field insulation body 20 is preferably composed of silicon dioxide.

The behavior of the electrical parameters of a Schottky barrier diode (SBD) fabricated on the Si face of a 4H—SiC epitaxial layer according to the present invention was studied. The study revealed that the devices according to the present invention exhibit an electrical behavior in accordance to thermoionic emission and a good MSI uniformity confirmed by C-V measurements. I-V measurements (I-V) were also performed in a large temperature range which led to an evaluation of the Richardson constant.

Details of the Study

Schottky barrier diodes were fabricated on 3" 4H—SiC wafers, production grade, produced by Cree Inc. Epitaxial body 12 and substrate 10 of wafers were n-doped (Nd=$10^{16}$ cm$^{-3}$, thickness 7 μm and Nd=$10^{18}$ cm$^{-3}$, thickness 380 μm, respectively). The junction extermination extension on fabricated devices was formed by a guard ring 18 obtained by P$^+$ type implantation and a mesa structure with an additional ring of silicon oxide 20. Schottky barrier 14 was made by thermal evaporation of Titanium and a successive Aluminum layer 24. Ohmic contact 16 formation was made on the back-side of the wafer by a triple evaporation of Titanium, Nickel and Silver.

Fabricated devices were then packaged in a standard TO-220 commercial package.

All step processes were optimized in previous work, leading to obtain a percentage of working diodes with a reverse current<50 μA@600 V of reverse voltage up to 85%.

Electrical measurements were performed by an SMU237 Keithley Source Measure Unit and an SMU238 Keithley Source Measure Unit. Doping concentration was controlled by C-V measurements at the standard frequency of 1 MHz (HP 4192A LF).

Electrical characterization versus temperature was performed by using an Oxford cryostat. The measurements were performed on selected devices which passed reliability tests working 1000 hours in stress conditions.

Results

In order to avoid any problems related to fabrication process and surface preparation, devices were selected with behavior close to ideal.

A first electrical characterization was done by standard I-V and C-V measurements fitting data according to thermoionic emission theory (TET) in order to obtain ideality factor, barrier height, doping concentration and reverse current at 600 V. The mean values were 1.02, 1.21 eV, $810^{15}$ cm$^{-3}$ and 30 μA. Break down voltage was higher than 1100 V, close to the ideal value. Twenty selected devices were tested further by voltage measurement versus time up to 1000 hour. The results demonstrated an optimal stability with unchanged characteristic.

Figure 2:
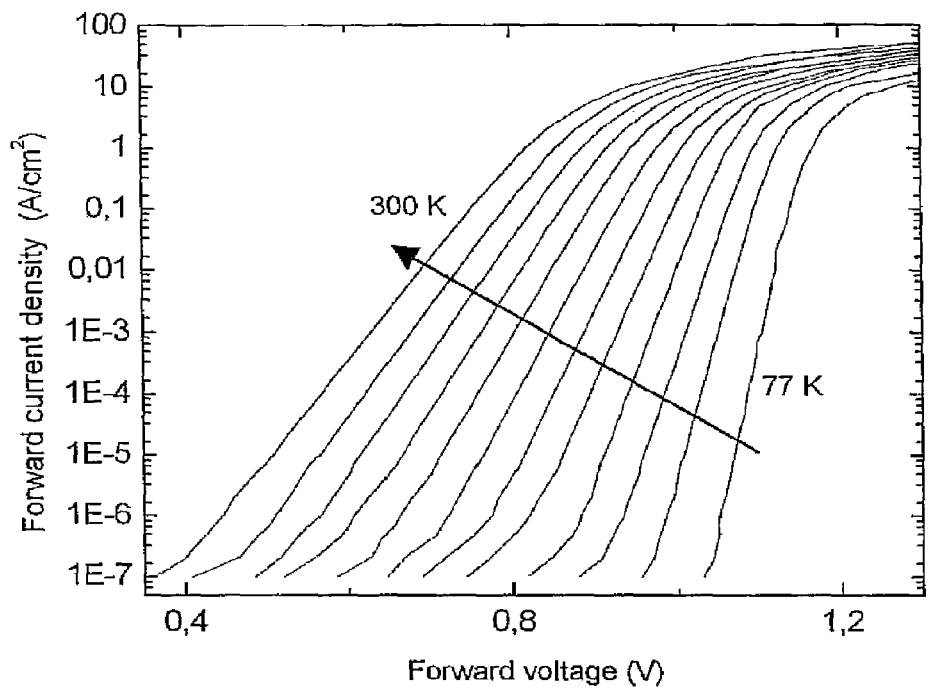
FIG. 2 graphically illustrates the I-V characteristics of a device according to the present invention as a function of temperature.

Electrical measurements were performed in the range 77-300 K with a temperature step of 20 K by means of forward and reverse current voltage analysis. FIG. 2 reports the semi logarithmic plot of the I-V curves of SBD, showing a linear behavior over seven orders of magnitude.

Table 1 reports barrier height and ideality factor versus temperature extracted from experimental data, according to TET and by using the classical value of 146 A K$^{-2}$ cm$^{-2}$. It is worth noting that the ideality factor is close to 1.1 up to 77 K, and in the range 200-300 K is almost constant. This leads to the conclusion that the barrier/metal interface is very homogeneous which is confirmed also by the Schottky height barrier value obtained by C-V measurements (1.2 eV).

TABLE 1

EXPERIMENTAL VALUES OF SCHOTTKY BARRIER HEIGHT AND IDEALITY FACTOR.

| TEMP (K) | BARRIER HEIGHT (eV) | IDEALITY FACTOR |
|---|---|---|
| 77 | 1.11 ± 0.2 | 1.13 ± 0.2 |
| 100 | 1.14 ± 0.2 | 1.1 ± 0.2 |
| 120 | 1.15 ± 0.2 | 1.09 ± 0.2 |
| 140 | 1.17 ± 0.1 | 1.07 ± 0.1 |
| 160 | 1.17 ± 0.1 | 1.07 ± 0.1 |
| 180 | 1.19 ± 0.1 | 1.05 ± 0.1 |
| 200 | 1.20 ± 0.1 | 1.04 ± 0.1 |
| 220 | 1.20 ± 0.1 | 1.04 ± 0.1 |
| 240 | 1.21 ± 0.1 | 1.03 ± 0.1 |
| 260 | 1.21 ± 0.1 | 1.03 ± 0.1 |
| 280 | 1.21 ± 0.1 | 1.03 ± 0.1 |
| 300 | 1.21 ± 0.1 | 1.03 ± 0.1 |

Figure 3:
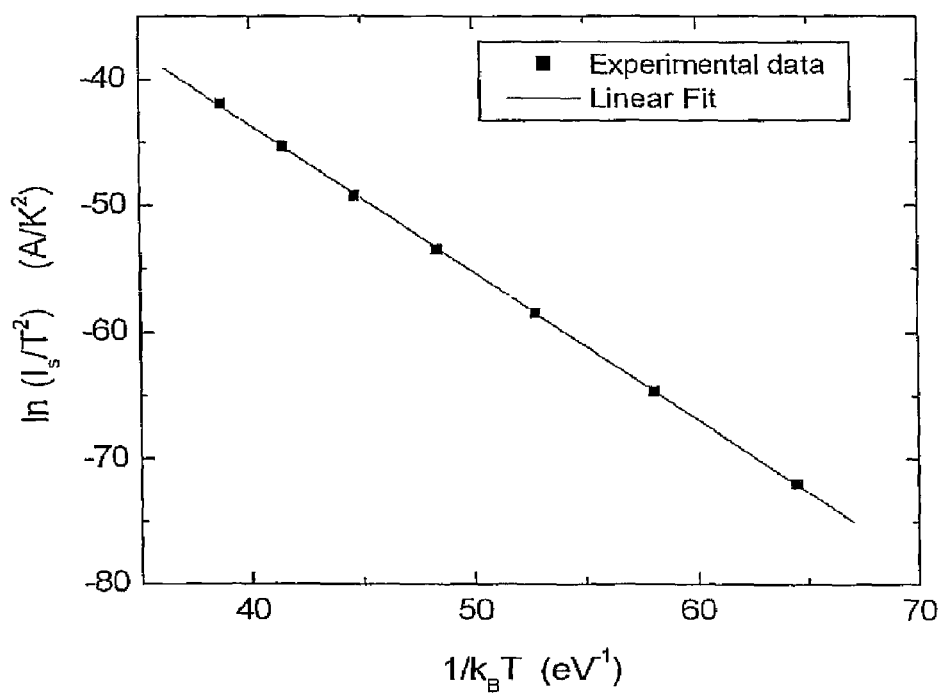
FIG. 3 illustrates a Richardson's plot of $\ln(Js/T^{**}2)$ versus $1/kT$, experimental data and linear fit.

In order to obtain additional information, for the determination of the effective barrier height and of the AA product, saturation current density was extracted from experimental data in the range 200-300 K and reported in a Richardson's plot (FIG. 3).

From the slope of the linear fit and from the intercept, one can obtain an effective value of barrier height of 1.16±0.1 eV and an effective Richardson's constant A=17±8 A K$^{-2}$ cm$^{-2}$. The Richardson's constant is different from the classical theoretical value. Many have tried to explain and model the Schottky contacts on SiC, in order to fit experimental data to the theoretical value. In theory, the value of the effective Richardson constant A* should be calculated for a semiconductor with indirect energy gap and a number $M_C$ of equivalent ellipsoidal constant energy surface in the first Brillouin zone, by considering diagonal components of the effective mass tensor. Such a theoretical calculation leads to Richardson constant values that are dependent on the particular crystallographic direction considered in Thermionic emission. The commonly reported value for the 4H—SiC Richardson constant was firstly calculated by loth et al., ISPSD '95 (1995) 101-106. It can be shown that such a value was obtained by simply averaging the effective mass value in Gotz et al., J. Appl. Phys., 73, No. 7, (1993) 3332-2228. neglecting any crystallographic anisotropy, and considering a number of equivalent conduction band minima equal to 6 (derived from the conduction band minimum location along the M-K edge of the first Brillouin zone reported in Tairov et al., "Electroluminescence", J. I. Parkov, Ed., Berlin-Heidelberg-New York, Springer-Verlag (1977). The location of the equivalent conduction band minima has been more recently demonstrated to be exactly at the M-point of the first Brillouin zone, and symmetry considerations lead to a number of equivalent minima $M_C$ equal to 3 (the constant energy surfaces are 6 semi-ellipsoids). Such a value for $M_C$ should be employed in the calculation of the effective Richardson constant of 4H—SiC.

Moreover, a modified Richardson constant A** should be derived from A* taking into account quantum mechanical tunneling and reflections at the Schottky interface and interactions of the emitted electrons with optical phonons, as suggested in Crowell et al., Solid-State Electron., 9 (1966) 1035-1048.

Such a complete model has never been applied to hexagonal materials, and to 4H—SiC in particular. Thus, the commonly accepted value of 146 A/cm$^2$V$^2$ was employed because it was estimated that an error of 30% in A* would affect the value of Schottky barrier height $\phi_B$ extracted from thermionic emission saturation current measurements of about 1%.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device, comprising:
a SiC substrate;
a silicon face SiC epitaxial body formed on a first surface of a said SiC substrate;
a Schottky metal barrier formed on said silicon face of said SiC epitaxial body; and
a back power electrode on a second surface of said SiC substrate wherein said Schottky metal barrier is configured to exhibit a voltage characterization of the barrier that reflects uniformity between said Schottky metal barrier and said silicon.

2. The semiconductor device of claim 1, wherein said Schottky metal barrier is comprised of Titanium.

3. The semiconductor device of claim 1, wherein said back electrode is comprised of a stack of Titanium, Nickel, and Silver.

4. The semiconductor device of claim 1, a region of another conductivity diffused into said SiC epitaxial body defining an outer boundary of an active region of said device.

5. The semiconductor device of claim 1, further comprising a field insulation body formed on said SiC epitaxial body, wherein said Schottky metal barrier extends over said field insulation body.

6. The semiconductor device of claim 5, wherein said field insulation body is comprised of silicon dioxide.

7. The semiconductor device of claim 5, wherein said field insulation body includes tapered sidewalls tapering toward said SiC epitaxial body.

8. The semiconductor device of claim 1, further comprising a front power electrode formed on said Schottky metal body.

9. The semiconductor device of claim 8, wherein said front power electrode is comprised of aluminum.

10. The semiconductor device of claim 1, wherein said SiC epitaxial body is comprised of 4H—SiC.

11. The semiconductor device of claim 10, wherein said SiC is comprised of 4H—SiC.

12. A Schottky diode comprising:
a silicon face SiC epitaxial body; and
a Schottky metal barrier formed on said silicon face of said SiC epitaxial body,
wherein said Schottky metal barrier is configured to exhibit a voltage characterization of the barrier that reflects uniformity between said Schottky metal barrier and said silicon.

13. The Schottky diode of claim 12 further comprising:
a back electrode comprising Titanium, Nickel, and Silver.

14. The Schottky diode of claim 12 further comprising:
a region of another conductivity diffused into said SiC epitaxial body defining an outer boundary of an active region of said Schottky diode.

15. The Schottky diode of claim 14 wherein said region of another conductivity forms a guard ring around said active region.

16. The Schottky diode of claim 12 wherein said SiC comprises 4H SiC.

17. The Schottky diode of claim 12 further comprising a ring of silicon oxide disposed between a portion of said Schottky metal and said SiC epitaxial body.

18. The Schottky diode of claim 12 characterized as having an ideality factor of less than 1.1 for temperatures above 140 K.

19. The Schottky diode of claim 12 characterized as having an ideality factor of less than or equal to 1.05 for temperatures above 200 K.

20. The Schottky diode of claim 12 characterized as having a breakdown voltage of greater than 1100 volts.

* * * * *